(12) United States Patent
Chen et al.

(10) Patent No.: US 7,122,412 B2
(45) Date of Patent: Oct. 17, 2006

(54) METHOD OF FABRICATING A NECKED FINFET DEVICE

(75) Inventors: Haur-Ywh Chen, Kaohsiung (TW); Fang-Cheng Chen, Hsin-chu (TW); Yi-Ling Chan, Miaoli (TW); Kuo-Nan Yang, Taipei (TW); Fu-Liang Yang, Hsin-Chu (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 26 days.

(21) Appl. No.: 10/835,789

(22) Filed: Apr. 30, 2004

(65) Prior Publication Data

US 2005/0253193 A1 Nov. 17, 2005

(51) Int. Cl.
*H01L 21/00* (2006.01)
*H01L 21/84* (2006.01)
(52) U.S. Cl. .................. 438/157; 438/283; 438/300
(58) Field of Classification Search ............. 438/157, 438/176, 197, 283, 300, 479, 517
See application file for complete search history.

(56) References Cited

U.S. PATENT DOCUMENTS

| 4,996,574 A | 2/1991 | Shirasaki |
| 5,309,010 A | 5/1994 | Kitajima |
| 5,428,237 A | 6/1995 | Yuzurihara et al. |
| 5,701,016 A | 12/1997 | Burroughes et al. |
| 6,071,783 A * | 6/2000 | Liang et al. ............ 438/301 |
| 6,242,783 B1 | 6/2001 | Ohmi et al. |
| 6,252,284 B1 | 6/2001 | Muller et al. |
| 6,583,469 B1 * | 6/2003 | Fried et al. ............ 257/329 |
| 6,794,720 B1 * | 9/2004 | Yagishita et al. ......... 257/353 |
| 6,858,478 B1 * | 2/2005 | Chau et al. ............ 438/149 |
| 6,927,104 B1 * | 8/2005 | Lee et al. ............... 438/149 |

* cited by examiner

*Primary Examiner*—Hoai Pham
(74) *Attorney, Agent, or Firm*—Haynes and Boone, LLP (57) ABSTRACT

A method of fabricating a double gate, FINFET device structure in a silicon on insulator layer, in which the channel region formed in the SOI layer is defined with a narrowed, or necked shape, and wherein a composite insulator spacer is formed on the sides of the device structure, has been developed. A FINFET device structure shape is formed in an SOI layer via anisotropic RIE procedures, followed by a growth of a silicon dioxide gate insulator layer on the sides of the FINFET device structure shape. A gate structure is fabricated traversing the device structure and overlying the silicon dioxide gate insulator layer located on both sides of the narrowest portion of channel region. After formation of a source/drain region in wider, non-channel regions of the FINFET device structure shape, composite insulator spacers are formed on the sides of the FINFET shape and on the sides of the gate structure. Metal silicide is next formed on source/drain regions resulting in a FINFET device structure featuring a narrow channel region, and surrounded by composite insulator spacers located on the sides of the device structure.

24 Claims, 6 Drawing Sheets

METHOD OF FABRICATING A NECKED FINFET DEVICE

BACKGROUND OF THE INVENTION (1) Field of the Invention

The present invention relates to methods used to fabricate semiconductor devices, and more specifically to a process sequence used top fabricate a FINFET device, a field effect transistor formed on an silicon on insulator (SOI) layer, with the mesa type device comprised with fin like features.

(2) Description of Prior Art

Micro-miniaturization, or the ability to fabricate semiconductor devices comprised with sub-micron features, have allowed performance increases for devices comprised with the sub-micron features to be realized, while the manufacturing cost of a specific semiconductor chip formed with sub-micron features has been reduced. The decrease in performance degrading junction capacitance as a result of the use of sub-micron features, as well as the ability to obtain a greater number of semiconductor chips, still providing circuit densities comparable to counterpart semiconductor chips formed with larger features, have made the increased performance, and decreased fabrication cost objectives achievable. However as device features shrink specific parameters such as short channel effects, punch through, and leakage currents become more prevalent for devices formed with sub-micron features than for counterparts formed with larger features.

This invention will describe a process sequence in which device performance is further improved via additional decreases in junction capacitance via formation of the sub-micron type device on a silicon on insulator (SOI) layer of the device. A FINFET device defined in the SOI layer, with only the needed elements of the device now overlying the insulator layer of the SOI layer, results in a reduction in capacitance and thus increased performance when compared to counterpart FET devices fabricating within a semiconductor substrate and thus presenting higher parasitic junction capacitance. The ability to form the FINFET device on an SOI layer also reduces punch through leakage and short channel effects when compared to devices formed in a semiconductor substrate. However to maintain a narrow channel region for the mesa like FINFET device the portion of conductive material between the source and drain regions has to be minimized. This can result in unwanted channel resistance, adversely influencing device performance. Therefore a process and design for a FINFET device, reported in this present invention, will describe a necked channel region in which only a portion of conductive material located between the source and drain region will be necked or narrowed, while the other portions of the conductive region located between the source and drain regions will be wider thus minimizing the channel resistance of the FINFET device. In addition this invention will describe a procedure used to form a wrap up insulator spacer that will protect the exposed sides of the raised, FINFET device from a silicide procedure applied to source/drain regions. Prior art, such as Muller et al, in U.S. Pat. No. 6,252,284B1, Shirasaki, in U.S. Pat. No. 4,996,574, Yuzurihara et al, in U.S. Pat. No. 5,428,237, Burroughes et al, in U.S. Pat. No. 5,701,016, Kitajama, in U.S. Pat. No. 5,309,010, and Ohmi et al, in U.S. Pat. No. 6,242,783B1, describe methods of forming FINFET type devices, however none of these prior arts disclose the unique features of this invention, such as the necked channel region, and the wrap up insulator spacer.

SUMMARY OF THE INVENTION

It is an object of this invention to fabricate a mesa structure in a SOI layer, with the mesa structure comprising a double gate FINFET device.

It is another object of this invention to reduce FINFET channel resistance via formation of a necked portion of channel region, only in a portion of a wider conductive region located between source and drain regions.

It is still another object of this invention to form a wrap up insulator spacer on the sides of the FINFET device to prevent silicide formation on exposed sides of the mesa like FINFET device.

In accordance with the present invention a method of fabricating a double gate FINFET device structure in a SOI layer, wherein features such as a necked channel region and a wrap up insulator spacer are employed to improve device performance, is described. Definition of the silicon layer component of the SOI layer, and of an overlying hard mask insulator layer, results in a raised structure comprised of a silicon source/drain shapes connected by a narrower channel region shape wherein a center portion of the raised silicon channel region shape is necked or narrowed. A thermal oxidation procedure results in the formation of a gate insulator layer on both sides of the necked channel region shape, followed by definition of a conductive gate structure formed normal in direction to the channel region shape, overlying the gate insulator layers located on both sides of the necked portion of the channel region shape. Removal of the hard mask insulator layer from portions of the silicon source/drain shapes is followed by formation of a source/drain region in the silicon source/drain shapes. A wrap up, composite insulator spacer is next formed on the sides of the raised silicon structure, protecting against a procedure used to form metal silicide on exposed portions of source/drain regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

The method of fabricating a double gate FINFET device structure, defined in an SOI layer, wherein features such as a necked channel region and a wrap up insulator spacer are employed to reduce channel resistance and to prevent silicide formation on the sides of the FINFET device structure, will now be described in detail. Semiconductor substrate 1, comprised of single crystalline silicon with a <100> crystallographic orientation, is used and schematically shown in cross-sectional style in FIG. 1B. Silicon layer 3, the silicon component of SOI layer 3, is formed via oxygen implantation into a portion of semiconductor substrate 1, followed by an anneal procedure which results in the formation of insulator layer 2, underlying an non-implanted, and non-oxidized silicon layer 3. Insulator layer 2, is comprised of silicon dioxide at a thickness between about 100 to 2000 Angstroms, while silicon layer 3, the top portion of semiconductor substrate 1, overlying insulator layer 2, is formed at a thickness between about 100 to 2000 Angstroms. If desired the SOI configuration can be obtained via bonding of a first semiconductor substrate to the top surface of an insulator layer located on a second semiconductor substrate. Removal of the bottom portion of the second semiconductor substrate, via chemical mechanical polishing (CMP), procedures, results in a remaining portion of the second semiconductor substrate, silicon layer 3, on the insulator layer, insulator layer 2, of the first semiconductor substrate, again resulting in the desired SOI configuration.

Figure 1A:
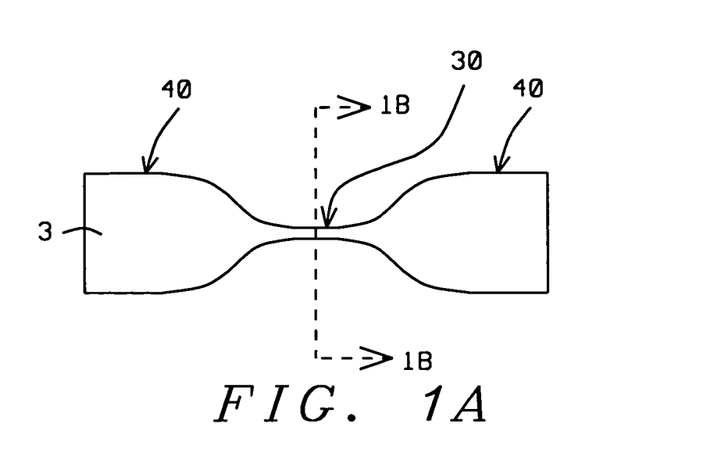
FIGS. 1A, 2A, 4A, 5A and 6A, which schematically show a top view of the double gate FINFET device structure at specific stages of fabrication.
Figure 1B:
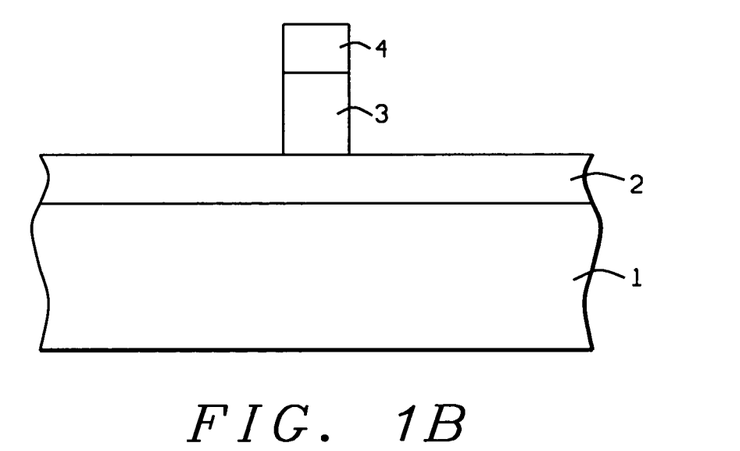
FIGS. 1B, 2B, 2C, 3, 4B, 4C, 5B, and 6B, which schematically in cross-sectional style show key stages used to fabricate the double gate, FINFET device structure described in this present invention.

The attainment of the mesa structure in silicon layer 3, to be used to accommodate the FINFET device structure is next addressed and schematically shown as a top view in FIG. 1A, and as a cross-sectional view in FIG. 1B. Insulator layer 4, comprised of silicon oxide at a thickness between about 10 to 500 Angstroms, to be used as a hard mask layer, is deposited on silicon layer 3, via low pressure chemical vapor deposition (LPCVD), or plasma enhanced chemical vapor deposition (PECVD), procedures. A photoresist shape, not shown in the drawings is then used as an etch mask to define the FINFET shape in silicon layer 3. This is accomplished via an anisotropic reactive ion etch (RIE), procedure, using $CHF_3$ as an etchant for insulator layer 4, and using $Cl_2$ as a selective etchant for silicon layer 3, with the silicon etch cycle selectively terminating at the appearance of underlying insulator layer 2. The silicon shape is comprised with wide regions 40, to be used to accommodate the subsequent source/drain regions of the FINFET device structure, while region 30, located between regions 40, will be used to accommodate the device channel region. To optimize device characteristics for a FINFET device comprised with a double gate configuration, or a gate structure located on each side of the channel region, a narrow channel width is desired to optimize device parameters such as sub-threshold voltage. However if the channel width remains narrow for the entire length between the source/drain region, or between regions 40, a larger than desired channel resistance will result, adversely influencing device performance, thus negating the performance benefits obtained from forming the device in an SOI layer. Therefore a novel design featuring necked channel region 30, is formed only in the portion of the channel region where an overlying gate structure will be subsequently defined, while the remaining portions of the raised silicon channel widens as it approaches regions 40. The width of channel region 30, at the narrowest location, the location in which the overlying gate structure will be formed, is between about 0.01 to 0.02 um, while the wider portions of the channel region, portions not to be covered by the subsequent gate structure, are between about 0.20 to 1.0 um. The result of the silicon definition procedure is schematically shown as a top view in FIG. 1A, and as a cross-sectional view in FIG. 1B.

Figure 2A:
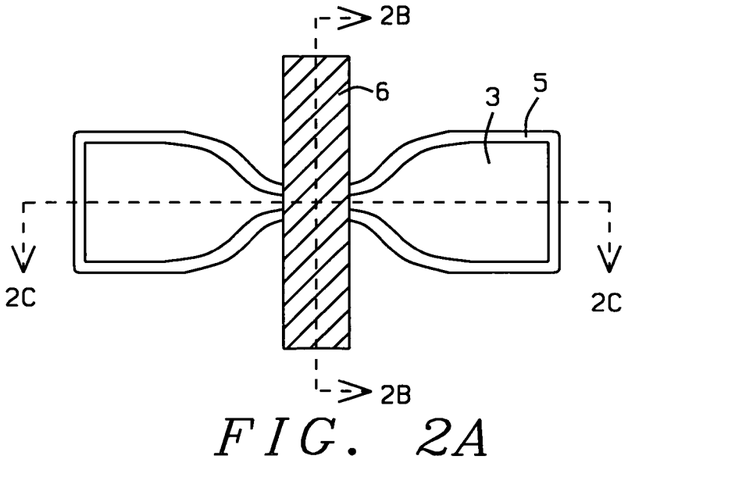
Figure 2B:
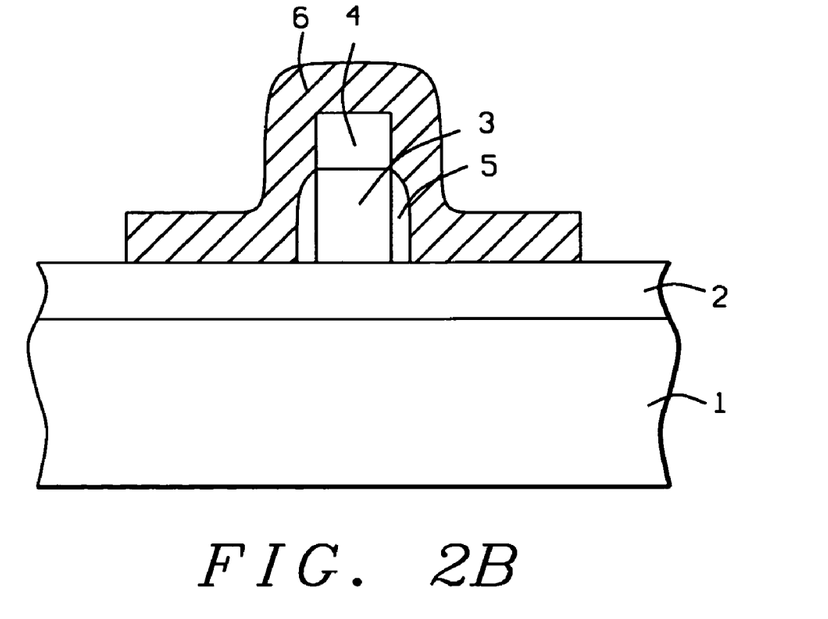
Figure 2C:
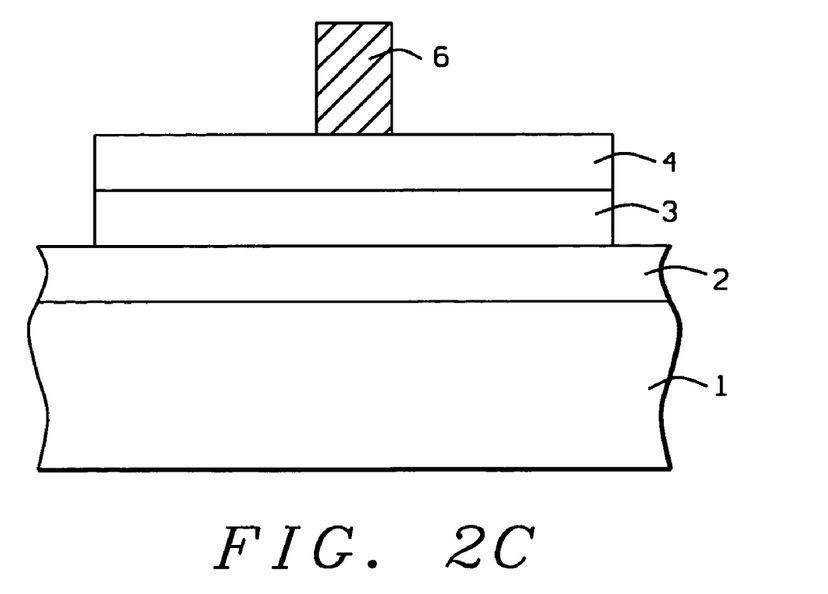

After removal of the photoresist shape used for definition of the silicon shape, via plasma oxygen ashing procedures, gate insulator layer 5, is thermally grown on the sides of the raised silicon structure. Gate insulator layer 5, comprised of silicon dioxide, is obtained at a thickness between about 6 to 100 Angstroms, via thermal oxidation procedures performed at a temperature between about 500 to 1200° C., in an oxygen-steam ambient. A conductive layer such as polysilicon, is next deposited via LPCVD procedures to a thickness between about 300 to 2000 Angstroms. A photoresist shape, not shown in the drawings, is next used as an etch mask to allow an anisotropic RIE procedure, using $Cl_2$ as an etchant, to define gate structure 6. This is shown schematically in top view 2A, in which gate structure 6, is located on insulator layer 4, overlying the top surface of narrow portion 30, of the channel region, while directly overlying gate insulator layer 5, on each side of narrow channel region 30. The presence of gate structure 6, on gate insulator layer 5, on each side of the narrow channel region allows formation of a double gate device to be realized. Cross-sectional views of the FINFET device structure at this stage of fabrication are schematically shown in FIGS. 2B and 2C. The photoresist shape used for definition of gate structure 6, is removed via plasma oxygen ashing procedures followed by a final wet clean cycle. The wet clean cycle, comprised with a buffered hydrofluoric acid dip, removes portions of gate insulator layer 5, not covered by gate structure 6.

Figure 3:
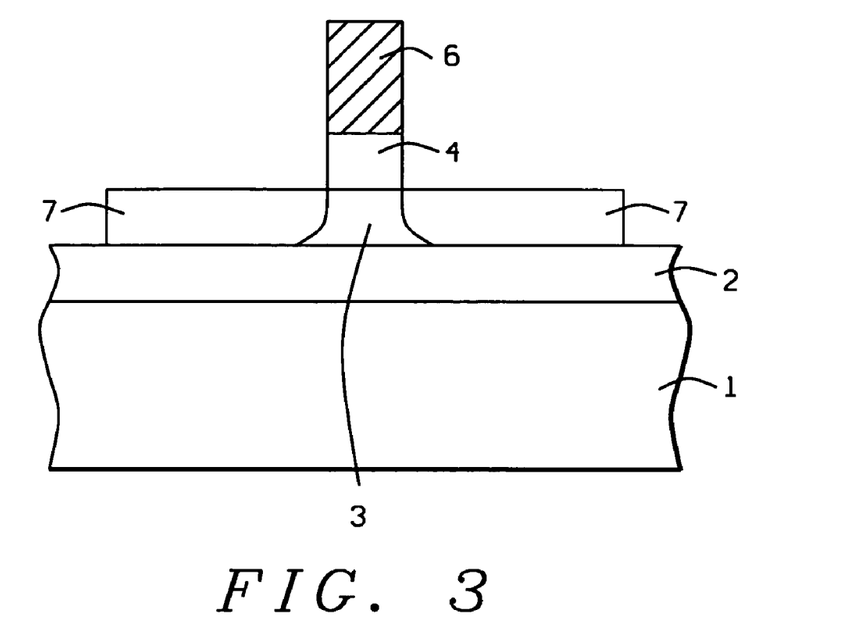

Selective removal of the portions of hard mask, insulator layer 4, not covered by gate structure 6, is next accomplished via a RIE procedure, using $CHF_3$ as a selective etchant for insulator layer 4, exposing regions of silicon layer 3, to be used for FINFET source/drain regions. Implantation of arsenic or phosphorous ions, performed at an energy between about 0.1 to 5 KeV, and at a dose between about 1E19 to 5E20 atoms/$cm^2$, is employed to create source/drain regions 7, in non-channel portions of silicon layer 3. The ability to form the source/drain regions, butting insulator layer 2, result in less junction capacitance, and thus increased device performance, when compared to counterpart devices formed in a semiconductor substrate. The result of these procedures is schematically shown in FIG. 3. The N type source/drain region 7, is used if an N channel, or NMOS FINFET device is desired. However if a P channel, of PMOS FINFET device is needed, source/drain regions 7, can be P type regions, obtained via implantation of P type ions such as boron.

Figure 4A:
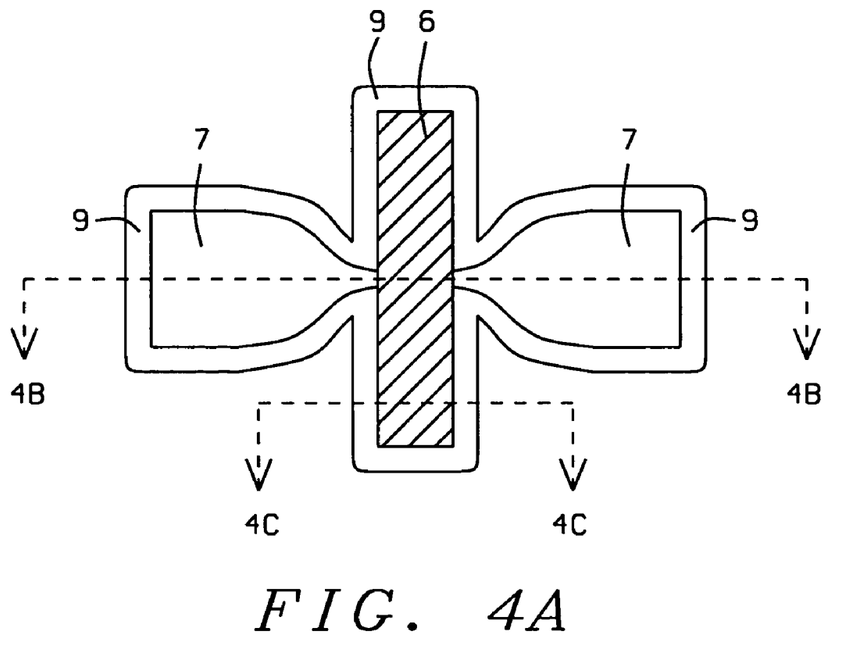
Figure 4B:
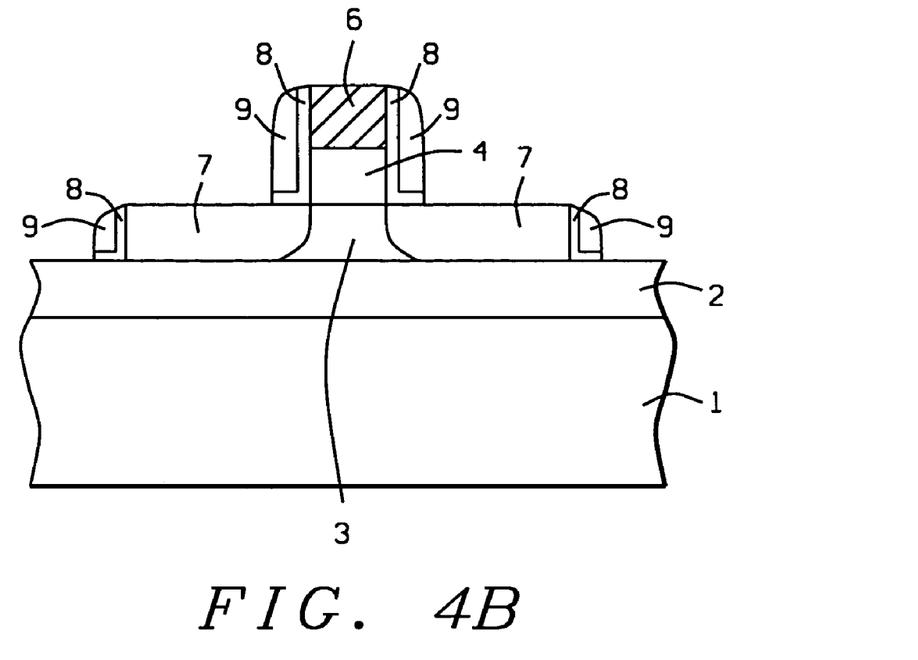
Figure 4C:
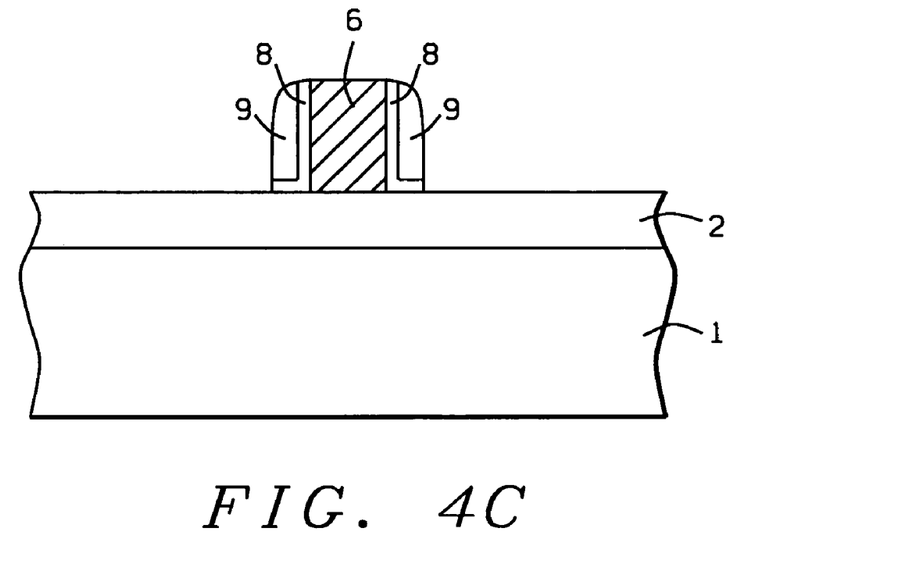

To further enhance the performance of the FINFET device via reduction in source/drain resistance, metal silicide contact regions are formed on top portions of the source/drain region. However selective formation of a metal silicide layer on exposed portions of silicon or polysilicon, can result in metal silicide formation on the sides of silicon layer 3, and on the exposed sides of conductive gate structure 6, resulting in unwanted gate to substrate bridging or shorting. Therefore prior to initiating a metal silicide formation procedure, insulator sidewall spacers are formed on vertical sides of defined silicon layer 3, as well as on the exposed sides of conductive, or polysilicon gate structure 6. A composite insulator spacer, comprised of an underlying silicon oxide component, and an overlying silicon nitride component, is next formed and schematically shown in cross-sectional style using FIG. 4B, and schematically shown as a top view in FIG. 4A. First silicon oxide layer 8, is conformally deposited, at a thickness between about 50 to 200 Angstroms, via LPCVD or PECVD procedures, followed by conformal deposition of silicon nitride layer 9, at a thickness between about 100 to 1000 Angstroms, again via use of LPCVD or PECVD procedures. An anisotropic RIE procedure using $Cl_2$ or $CF_4$ as an etchant for silicon nitride layer 9, and using $CHF_3$ as an etchant for silicon oxide layer 8, is employed to define the composite insulator spacers on the sides of defined silicon layer 3, and on the sides of gate structure 6, exposing the top surface of source/drain region 7. The composite insulator spacers, referred to as wrap up spacers, wrap around all exposed sides of the defined FINFET shape in silicon layer 3, as well as wrapping around the sides of gate structure 6.

Figure 5A:
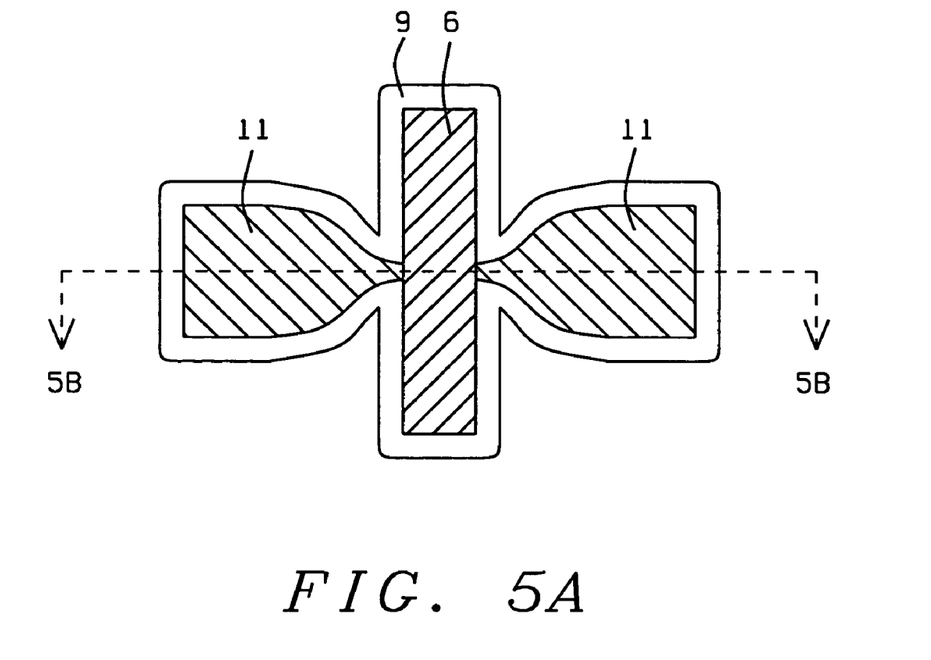
Figure 5B:
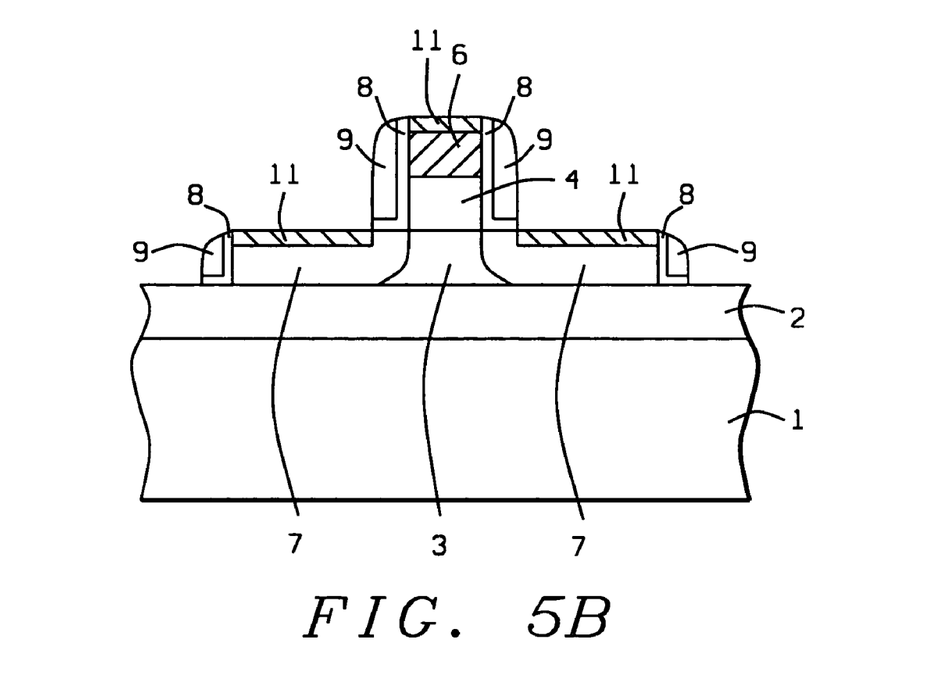

The desired metal silicide layer can now be selectively formed on exposed portions of source/drain region 7, as well as on the top portion of conductive gate structure 6, without risk of source/drain to gate shorting. A metal layer such as titanium, tungsten, tantalum, cobalt, or nickel, is deposited via plasma vapor deposition (PVD), procedures, to a thickness between about 100 to 500 Angstroms. An anneal procedure is next performed at a temperature between about 450 to 950° C, for a time between about 0.01 to 10 min, in an inert ambient, resulting in the formation of metal silicide layer 11, a layer such as titanium silicide, tungsten silicide, tantalum silicide, cobalt silicide, or nickel silicide, on the exposed surface of the source/drain and on the top surface of the conductive gate region. Portions of the metal layer residing on insulator surfaces such as surfaces of the composite insulator spacers, remain unreacted and are selectively removed via wet etch procedures using a solution comprised of $H_2SO_4$—$NHOH_4$—$HCl$—$H_2O_2$, resulting in metal silicide layer 11, only overlying portions of source/drain region 7, and conductive gate 6. This is schematically shown for the top view in FIG. 5A, while FIG. 5B, schematically shows a cross-sectional view of the FINFET device structure at this specific stage of fabrication.

Figure 6A:
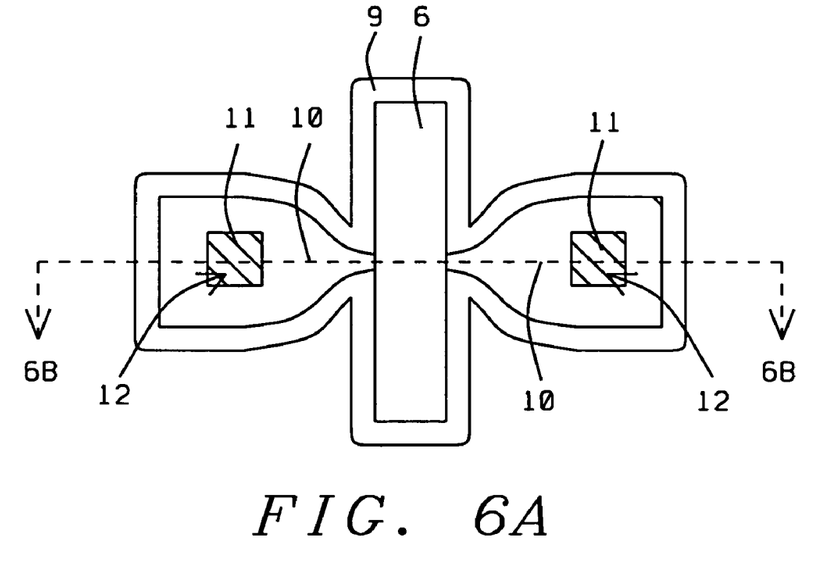
Figure 6B:
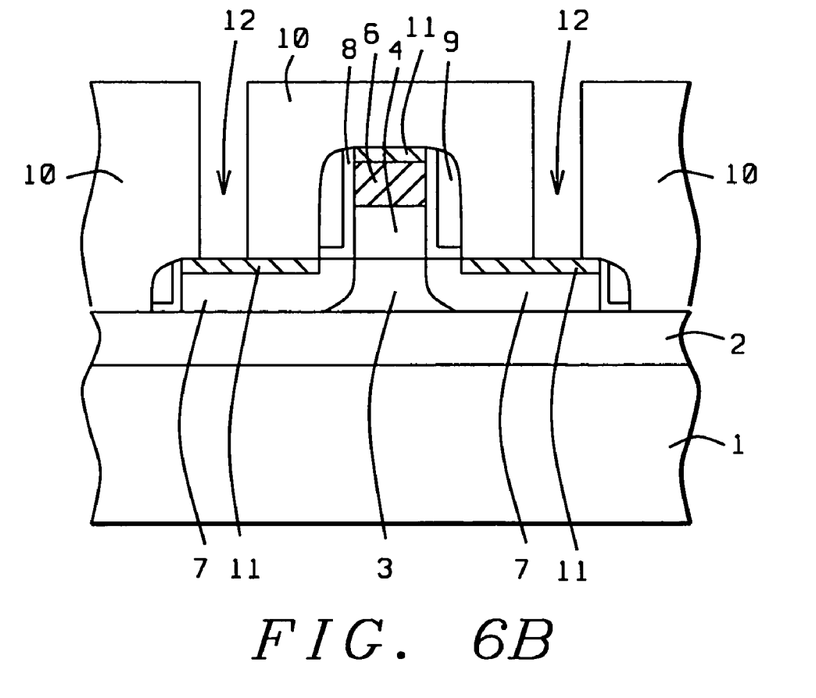

Interlevel dielectric (ILD), layer 10, comprised of silicon oxide, or boro-phosphosilicate glass (BPSG), is next deposited to a thickness between about 1000 to 5000 Angstroms, via LPCVD or PECVD procedures. Planarization of ILD layer 10, is accomplished via a CMP procedure resulting in a smooth top surface topography for ILD layer 10. A photoresist shape, not shown in the drawings, is next used as a mask allowing a RIE procedure to define contact openings 12, in ILD layer 10, exposing a portion of the top surface of metal silicide layer 11, in a region in the metal silicide layer is located on source/drain region 7. The RIE procedure is performed using $CHF_3$ as an etchant for ILD layer 10. The result of these procedures are shown schematically as top view 6A, and cross-sectionally using FIG. 6B. Metal contact structures, not shown in the drawings, can now be formed in contact openings 12. The result of the above process sequence is a double gate FINFET device structure, defined from a SOI layer, featuring a low resistance, necked channel region designed to enhance device performance, and featuring a wrap up insulator spacer, used to protect against gate to source/drain shorts.

While this invention has been particularly shown and described with reference to, the preferred embodiments thereof, it will be understood by those skilled in the art that various changes in form and details may be made without departing from the spirit and scope of this invention.

What is claimed is:

1. A method of forming a field effect transistor (FET) structure in a silicon on insulator (SOI) layer, comprising the steps of:

providing said SOI layer on a semiconductor substrate;
    defining a FET shape in said SOI layer with said FET shape having a necked channel region and having spaced wider silicon shapes disposed on opposite sides of said necked channel region, said necked channel region having a central portion where said necked channel region has its smallest width, and said necked channel region increasing progressively in width on each side of said central portion in directions away from said central portion toward each of said wider silicon shapes;
    forming a gate insulator layer on sides of said FET shape;
    forming a gate structure on said central portion of said necked channel region of said FET shape, with said gate structure engaging said gate insulator layer on each side of necked channel region;
    forming a source/drain region in said wider silicon shapes;
    forming an insulator spacer on sides of said FET shape not covered by said gate structure, and on sides of said gate structure; and
    forming a metal silicide layer on said source/drain region resulting in said FET structure comprised with said necked channel region.

2. The method of claim 1, wherein an insulator component underlying said SOI layer is a silicon dioxide layer at a thickness between about 100 to 2000 Angstroms.

3. The method of claim 1, wherein a silicon component of said SOI layer is a silicon layer at a thickness between about 100 to 2000 Angstroms.

4. The method of claim 1, wherein a hard mask insulator layer located overlying SOI layer is a silicon oxide layer, obtained via low pressure chemical vapor deposition (LPCVD) or plasma enhanced chemical vapor deposition (PECVD) procedures, at a thickness between about 10 to 500 Angatroms.

5. The method of claim 1, wherein said FET shape is defined in a hard mask insulator layer and in said SOI layer via an anisotropic RIE procedure using $CHF_3$ as an etchant for said hard mask insulator layer and using $Cl_2$ as etchant for said SOI layer.

6. The method of claim 1, wherein said smallest width of said necked channel region of said FET shape is between about 0.01 to 0.20 um.

7. The method of claim 1, wherein said gate insulator formed on sides of said FET shape, is a silicon dioxide layer at a thickness between about 6 to 100 Angatroms, obtained via temial oxidation procedures performed in an oxygen-steam ambient at a temperature between about 500 to 1200° C.

8. The method of claim 1, wherein said gate structure is a polysilicon gate structure, formed at a thickness between about 300 to 2000 Angstroms.

9. The method of claim 1, wherein said source/drain region is formed via implantation of arsenic or phosphorous ions, at an entry between about 0.1 to 5 KeV, at a dose between about 1E19 to 5E20 atoms/cm$^2$.

10. The method of claim 1, wherein said insulator spacer formed on sides of said FET shape and sides of said gate structure is a composite insulator spacer, comprised of an underlying silicon oxide component at a thickness between about 50 to 200 Angstroms, and comprised of an overlying silicon nitride component at a thickness between about 100 to 1000 Angstrom.

11. The method of claim 1, wherein said metal silicide layer is chosen from a group containing such metal silicide layers as titanium silicide, tungsten silicide, nickel silicide, and cobalt silicide.

12. A method of forming a double gate FINFET structure in a SOI layer, comprising the steps of:

forming said SOI layer on a semiconductor substrate;
    depositing a silicon oxide layer on said SOI layer;
    performing a first anisotropic dry etch procedure that etches said silicon oxide layer and at least a silicon layer in said SOI layer to define an FET shape having a necked channel region and having spaced wider shapes disposed on opposite sides of said necked channel region, said necked channel region having a central portion where said necked channel region has its smallest width, and said necked channel region increasing progressively in width on each side of said central potion in direction away from said central portion toward each of said wider shapes;

growing a silicon dioxide gate insulator layer on sides of said FET shape;

depositing a polysilicon layer over at least said central portion of said necked channel region and portions of said silicon dioxide gate insulator lover located on each side of said central portion of said necked channel region;

performing a second anisotropic dry etch procedure that etches said polysilicon layer to define a polysilicon gate structure overlying said central portion of said necked channel region, and overlying said silicon dioxide gaze insulator layer located an each side of said necked channel region, resulting in a vertical double gate device configuration;

removing said silicon oxide layer from said wider shapes;

performing an ion implantation procedure to form a source/drain region in said wider shapes;

depositing a composite insulator layer over at least sides of said FET shape not covered by said polysilicon gate structure and sides of said polysilicon gate structure, said composite insulator layer including an underlying silicon oxide layer and an overlying silicon nitride layer;

performing a third anisotropic dry etch procedure to etch said composite insulator layer to form a composite insulator spacer on sides of said FET shape not covered by said polysilion gate structure, and on sides of said polysilicon gate structure, said composite insulator spacer including an underlying silicon oxide component and an overlying silicon nitride component; and forming a metal silicide layer on said source/drain region resulting in said double gate FINFET structure comprised with said necked channel region and comprised with said composite insulator spacer.

13. The method of claim 12, wherein an insulator component of said SOI layer is a silicon dioxide layer at a thickness between about 100 to 2000 Angstroms.

14. The method of claim 12, wherein a silicon component of said SOI layer is a silicon layer at a thickness between about 100 to 2000 Angstroms.

15. The method of claim 12, wherein said silicon oxide layer is obtained via low pressure chemical vapor deposition (LPCVD) or plasma enhanced chemical vapor deposition (PECVD) procedures, at a thickness between about 10 to 500 Angstroms.

16. The method of claim 12, wherein said first anisotropic dry etch procedure used to define said FET shape in said silicon oxide layer and in said SOI layer is a anisotropic reactive ion etch (RIE) procedure performed using CHF3 as an etchant for said silicon oxide layer and using Cl2 as a etchant for said SOI layer.

17. The method of claim 12, wherein said smallest width of said necked channel region of said FET shape is between about 0.01 to 0.20 um.

18. The method of claim 12, wherein said silicon dioxide gate insulator layer located on sides of said FET shape is a silicon dioxide layer formed to a thickness between about 6 to 100 Angstroms, via a thermal oxidation procedure performed in an oxygen-steam ambient at a temperature between about 500 to 1200° C.

19. The method of claim 12, wherein said polysilicon layer is obtained via LPCVD procedures at a thickness between about 300 to 2000 Angstroms.

20. The method of claim 12, wherein said second anisotropic dry etch procedure used to define said polysilicon gate structure is an anisotropic RIE procedure performed using $Cl_2$ as an etchant for polysilicon.

21. The method of claim 12, wherein said ion implantation procedure used to form said source/drain region is performed via implantation of arsenic or phosphorous ions at an energy between about 0.1 to 5 KeV, at a dose between about 1E19 to 5E20 atoms/cm2.

22. The method of claim 12, wherein said composite insulator layer is comprised of said underlying silicon oxide layer obtained via LPCVD or PECVD procedures at a thickness between about 50 to 200 Angstroms, and comprised of an overlying silicon nitride layer obtained via LPCVD or PECVD procedures at a thickness between about 100 to 1000 Angatroms.

23. The method of claim 12, wherein said third anisotropic dry etch procedure used to define said composite spacer is an anisotropic RIE procedure performed using $Cl_2$ or $CF_4$ as an etchant for said silicon nitride layer, and using CHF3, as an etchant for said silicon oxide layer.

24. The method of claim 12, wherein said metal silicide layer is chosen from a group of metal silicide layers such as titanium silicide, tungsten silicide, tungsten silicide, nickel silicide, or cobalt silicide.

* * * * *